United States Patent

Ernick et al.

[15] 3,639,815

[45] Feb. 1, 1972

[54] EPI BASE HIGH-SPEED POWER TRANSISTOR

[72] Inventors: Frederick G. Ernick, Latrobe; Paul M. Kisinko, Greensburg; Joseph Marino, Irwin, all of Pa.; Peter J. Kannam, Princeton, N.J.

[73] Assignee: Westinghouse Electric Corporation, Pittsburgh, Pa.

[22] Filed: Sept. 30, 1969

[21] Appl. No.: 862,280

Related U.S. Application Data

[63] Continuation-in-part of Ser. No. 694,552, Dec. 29, 1967, abandoned.

[52] U.S. Cl.................317/235 R, 317/235 X, 317/235 AM, 317/235 AJ, 148/175

[51] Int. Cl.........................................................H01l 11/06

[58] Field of Search................317/235 X, 235 AM; 148/175

[56] References Cited

UNITED STATES PATENTS

| | | | |
|---|---|---|---|
| 3,145,447 | 8/1964 | Rummel | 317/235 |
| 3,166,448 | 1/1965 | Hubner | 317/235 |
| 3,271,208 | 9/1966 | Allegretti | 317/235 |
| 3,418,181 | 12/1968 | Robinson | 317/235 |
| 3,512,056 | 5/1970 | Chu et al. | 317/235 |

FOREIGN PATENTS OR APPLICATIONS

| | | | |
|---|---|---|---|
| 298,523 | 11/1965 | Netherlands | 317/235 |

*Primary Examiner*—Jerry D. Craig
*Attorney*—F. Shapoe and C. L. Menzemer

[57] ABSTRACT

A transistor having an epitaxially grown base region has the good secondary breakdown voltage performance of a single diffused transistor having a base region comprising suitably doped material having a uniform level of impurity concentration as well as all of the desirable frequency response benefits achieved by epitaxially formed transistors.

7 Claims, 11 Drawing Figures

WITNESSES

Theodore F. Wrobel

Donald M. Winegar

INVENTORS

Frederick G. Ernick, Paul M. Kisinko, Joseph Marino & Peter J. Kannam

BY

C. L. Menzemer

ATTORNEY

EPI BASE HIGH-SPEED POWER TRANSISTOR

CROSS-REFERENCE TO RELATED APPLICATION

This application is a continuation-in-part of U.S. Pat. application Ser. No. 694,552 filed Dec. 29, 1967 now abandoned.

BACKGROUND OF THE INVENTION

1. Field of the Invention

This invention relates to high-speed power transistors and process for producing the same. 2. Description of the Prior Art It is desirable that high-speed power transistors have a low collector to emitter saturation voltage, a high amperage gain and good secondary breakdown performance. Prior high-speed power transistors employed a base region formed by diffusion. A diffused base region does not have a uniform resistivity.

An object of this invention is to provide a high-speed power transistor having a low collector to emitter saturation voltage, a high amperage gain, and good secondary breakdown performance.

Another object of this invention is to provide a high-speed power transistor comprising an epitaxially grown base region having a uniform resistivity, a constant level of impurity concentration profile, and a predetermined base width to optimize the values achieved for secondary breakdown, current gain and frequency response.

Other objects of this invention will, in part, be obvious and will, in part, appear hereinafter.

SUMMARY OF THE INVENTION

In accordance with the teachings of this invention, there is provided a high-power, high-speed transistor with optimized secondary breakdown, current gain and frequency response characteristics by applying (1) a 4 to 11 micron thick P-type monocrystalline epitaxial base layer region having a constant level of impurity concentration profile of from 0.3 to 0.6 ohm-centimeter upon the top surface of a substrate which substrate forms the collector region of the transistor and comprises a lowermost N doped region parallel to the bottom surface with a very low resistivity of the order of 0.10 ohm-centimeter or less, and an N-type region of a thickness of from 15 to 25 microns in the uppermost portion of the substrate having a resistivity of from about 2 to 100 ohm-centimeters, and preferably 8 to 30 ohm-centimeter, and (2) an N+ type emitter layer region is provided on the upper surface of the P-type epitaxially grown monocrystalline region to provide the base width of the transistor, and (3) a P+ type region surrounding and contacting the N+ type emitter layer and in contact with the P-type epitaxial layer.

DRAWINGS

In order to more fully understand the teachings of this invention, reference should be had to the following drawings, in which.

DESCRIPTION OF THE INVENTION

The collector region of the high-power transistor of this invention is formed by a suitable means to achieve high lifetime characteristics which will help in enabling the transistor to function as a high-voltage power transistor with high usable current gain, saturation voltage and frequency response. The collector region preferably is formed of two distinct regions wherein the upper region which is in contact with the epitaxial base region has a resistivity much greater than the lower region. Additionally, the upper region contiguous with the base region of the transistor should have a substantially constant impurity concentration profile whereas the other or lower part of the collector region may have either a graded or a substantially constant impurity profile.

In an NPN high-speed high-power transistor, it is preferred that the collector region of the transistor be of N-type semiconductivity. One method of forming the collector region is to start initially with a substrate of semiconductor material whose dopant impurity material is one which produces N-type semiconductivity therein. The substrate has two opposed major surfaces and preferably the semiconductor material comprising the substrate is a silicon wafer suitably doped with N-type dopant to the desired level of resistivity. Silicon wafers of N-type semiconductivity commercially obtainable today have higher lifetime characteristics and less imperfections than what is usually obtainable by epitaxial growth techniques. This initial starting wafer is doped by diffusion through one of the two major opposed surfaces with a suitable impurity such, for example, as phosphorus or arsenic to produce a region of N-type semiconductivity having a lesser resistivity than the initial starting material. This diffusion process produces the desired collector region having two separate regions of the same type semiconductivity but having different levels of impurity concentration.

An alternate method of producing the region of N-type semiconductivity having a resistivity lower than the initial starting material is to grow epitaxially a monocrystalline layer of suitably doped semiconductor material, such for example, as silicon if the substrate be silicon on what will be the bottom major surface of the substrate.

Another method of forming the two resistivity portions of the collector region of a high-speed, high-power transistor of this invention is to grow epitaxially the region of semiconductor material having the higher resistivity as a monocrystalline layer on the top surface of a suitable substrate of semiconductor material.

Figure 1:
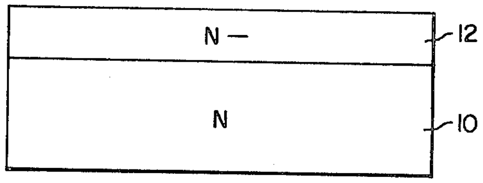
FIGS. 1 through 7 are cross-sectional views of a body of semiconductor material processed in accordance with the teachings of this invention.

With reference to FIG. 1, there is shown a body 10 of semiconductor material which forms the collector region. The body 10 may comprise any semiconductor material suitable for making a power transistor. However, silicon is preferred because it has the best all around physical and electrical characteristics which are desirable to fulfill predetermined parameters. The body 10 should have as low a resistivity as possible, that is 0.10 ohm-centimeter or less. There are commercially available silicon wafers of a resistivity of 0.01 ohm-centimeter.

Since the body 10 will undergo several high-temperature process steps, it is desirable that the material comprising the body 10 should be thermally stable. Therefore it is necessary that the material comprising the impurity in the body 10 of silicon should preferably have a low diffusion constant. Antimony and arsenic have low diffusion constants. Therefore, the employment of an antimony doped body 10 reduces out-diffusion during any subsequent epitaxial growth process step which is practiced. The body 10 preferably comprises, therefore, N-type semiconductivity antimony doped silicon semiconductor material having a resistivity of about 0.01 ohm-centimeter or less.

A region 12 of N-type semiconductivity silicon is epitaxially grown on a surface of the body 10 by any suitable means as is well known to those skilled in the art. The N-region 12 has a resistivity of from 2 to 100 ohm-centimeter and is the basic portion of the collector region of the power device since it supports almost all of the sustaining voltage of the power transistor. The region 12 is from 15 to 25 microns in thickness and preferably has a resistivity of from 8 to 30 ohm-centimeter for a high-speed power transistor having a sustaining voltage of about 200 volts. As an example, the region 12 is 20 microns in thickness and has a resistivity of 11 ohm-centimeter. The parameters set forth for the region 12 are a compromise between several factors. For breakdown voltage purposes between the collector and the base of a device embodying the body 10, the resistivity of the region 12 should be as high as possible and the thickness of the region 12 should be as thick as possible. However, for saturation voltage purposes, the resistivity should be as low as possible and the thickness of the region 12 should be as thin as possible. Additionally to achieve the greatest gain for a device embodying the body 10 one also wants the region 12 to have as low a resistivity as possible as well as a thickness which is as thin as possible.

For a high-speed high-power transistor it is desirable that for a sustaining voltage of 90 volts for the collector the maximum-collector-emitter voltage for the transistor should be 150 volts and the gain should be 20 at a 20-ampere collector current for a collector saturation voltage of less than 1 volt.

Additionally, it has been found that when high-speed high-power transistors have a sustaining voltage exceeding approximately 300 volts, the thickness of the region 12 affects the frequency response and the saturation voltage of the transistor. As the thickness of the region 12 increases, the capacitance of the region 12 decreases, the frequency response of the transistor decreases and the saturation voltage increases. Below approximately 300 volts there appears to be no significant effect of the thickness of the region 12 on the frequency response of the transistor.

It is desirable to form the region 12 by epitaxial growth since a sharply defined junction will be formed between the region 12 and the body 10. A diffusion process will not provide a sharply defined junction. During the epitaxial growth, the impurity can be introduced uniformly into the growing material and the resulting region 12 is uniformly doped throughout, that is, it has a substantially constant impurity concentration profile throughout the region 12. Phosphorus is a suitable impurity to be employed as a dopant as it is easy to work with. However, antimony and arsenic are other suitable dopants.

The preferred constant impurity concentration profile throughout the region 12 is also obtainable by employing commercially available silicon meeting the requirements of region 12 as a starting substrate. Material meeting the requirements of the body 10 is then epitaxially grown on a surface of the region 12 after suitable surface preparation or the region 12 substrate may be suitable diffused to obtain a region meeting the requirements of the body 10. Preferably material having the requirements of the body 10 is grown epitaxially on a surface of the region 12 to produce a sharply defined junction between the grown material and the region 12.

The preparation of the surface of the body 10 upon which the region 12 is to be epitaxially grown becomes increasingly important as the sustaining voltage of the high-speed power transistor of this invention is increased. Below about 200 volts sustaining, a high-speed power transistor embodying the conventional material surface preparation of the body 10 followed by an epitaxial growth process which includes in situ gaseous etching of the body 10 followed by the epitaxial growth of the region 12 in one continuous material growth process appears to be acceptable. However, above about 200 volts sustaining voltage, although the desired high sustaining voltage is achieved, the desired current gain, the desired saturation voltage and the desired frequency response of the high-speed power transistor is not obtainable by the same process.

It appears that trace amounts of heavy metal ions still remaining on the surface of the body 10 after material preparation are diffused into the body 10 during the heating of body 10 to the elevated temperature required for practicing gaseous etching of the body 10 prior to the epitaxial growth of the region 12. These trace amounts of heavy metal ions are apparently diffused far enough into the body 10 before gaseous etching begins that many of them never are removed from the body 10 regardless of how long the gaseous etching is practiced. Consequently the lifetime of the body 10 is decreased and the lifetime of the region 12 as well as that of a subsequently applied base region 14 are also affected. The base region 14 apparently traps some of these metal ions which are removed from the surface and contaminate the ambient of the epitaxial growth furnace during the epitaxial growth process.

It has been found that after preparation of the starting substrate, which includes chemical polishing, the surfaces of the substrate still have trace amounts of at least copper metal ions remaining thereon. It has been found that a chelating agent will remove these trace amounts of copper metal ions whereas the usual cleaning solutions such, for example as acid rinses and iodine solutions do not remove these trace amounts of heavy metal ions. The preferred chelating agent is ethylene diaminetetraacetic acid, known more commonly as EDTA. EDTA is not too soluble in water and therefore an ammonical solution of EDTA is preferred since the ammonical salt of EDTA is more soluble in water, as well as forming a soluble coupler ion with the copper ions present, and leaves no undesirable ions in the substrate's surface. It is desirable to get as much EDTA dissolved in the solution in order to remove the trace amounts of copper metal ions from the surfaces of the substrate more readily. The solution should have a pH reading of no greater than 9 and preferably be approximately 8. Additionally a detergent or surfactant may be added to the solution to reduce the surface tension of the solution thereby wetting the surfaces of the semiconductor material more readily and to assist in removing the trace amounts of copper metal ions more readily. Mechanical agitation of the cleaning solution such, as the employment of ultrasonic agitation is also desirable. A preferred aqueous chelating solution having a total volume of 4 liters has dissolved therein 6 grams of EDTA, 28 milliliters of ammonium hydroxide of 28 percent to 30 percent concentration by volume, 100 ml. of a surfactant solution comprising 10 percent by volume of, for example, nonylphenoxypoly(ethylenoxy) ethanol (commercially available under the trade name of Igepal) and the balance is filtered, deionized water.

The substrate is cleaned in the solution for 10 minutes, rinsed in deionized distilled water either blown dried or dried under a heat lamp.

Examination of the surfaces of the substrate after cleaning in the chelating solution shows the surfaces to be substantially free of the trace amounts of copper metal ions. In fact no trace metal ions of any kind are detected on the cleaned surface of the substrate but the apparatus used for the investigation has the following limitations of detecting ability: copper 0.005 p.p.m. iron 0.03 p.p.m. gold 0.01 p.p.m. and silver 0.006 p.p.m. If trace amounts of metals still exist on the substrate surface, the amount of such ions present does not exceed the amounts previously given as the limits of the detecting apparatus.

Surprisingly, employment of this chelating process step to clean the surfaces of the substrate improves the gain of the power transistor by a factor of 5 and at least doubles the current handling ability of the power transistor. Power transistors having a gain of 20 for a collector current of 20 amperes before the chelating process was employed still have a gain of 20 after employment of the chelating process but the collector current it is capable of handling is now 60 amperes. An increase in frequency response is also noted, the frequency response being increased by a factor of almost 2. For example, power transistors before the chelating process exhibited a frequency response of from 30 to 40 megacycles per second at 1 ampere of collector current whereas after employing the chelating process, the frequency response at the same current rating is from 50 to 70 megacycles per second.

It is believed that the chelating solution is removing trace amounts of metal ions which previously diffused into the various regions of the power transistor during high-temperature material processing. These diffused metal ions apparently reduced the lifetime of the material of the regions and consequently adversely affected the electrical properties of the power transistor.

Employing this chelating solution the 200-volt sustaining parameter which appeared as a plateau of maximum sustaining voltage for a power transistor having a minimum gain of 5 and an acceptable switching speed has been surmounted. Power transistors having a sustaining voltage of 450 volts have been realized and have a minimum gain of 5 for a collector current of 5 amperes at a collector-emitter potential of 4 volts. The saturation voltage of a 450 volt sustaining power transistor is still less than 1 volt but this is now rated for a collector current of 10 amperes which is still acceptable for commercial applications. One skilled in the art, will appreciate the realization that what you gain in one characteristic of the electrical parameters must be obtained by sacrificing a portion of one or more other characteristics of the electrical parameters.

It appears that it may be desirable to employ the chelating solution treatment prior to each high-temperature process in processing the body 10 although a 450 volt sustaining power transistor manufacturing process need not employ this embodiment. The more trace amounts of metal ions one can remove from the surfaces the better became the lifetime of the regions of power transistor. However, economic factors may prove more than one chelating treatment to be unprofitable for a given product. It appears also that phosphorus employed in the diffusion of an emitter region in the power transistor may act as a gettering agent for some of the trace amounts of metal ions encountered.

When a high-speed power transistor of this invention is to be made having a sustaining voltage of more than 200 volts and embodies a substrate having the desired characteristics of the region 12, the surface of the region 12 upon which a base region of the transistor is to be grown should be cleaned by a solution of the suitable chelating agent disclosed heretofore. Additionally, regardless of whether a region having the characteristic of the body 10 is to be formed by diffusion into the starting substrate, or by an epitaxial growth on the substrate, the surface upon which either of the processes is to be practiced should also be cleaned in the chelating solution as disclosed heretofore.

Figure 2:
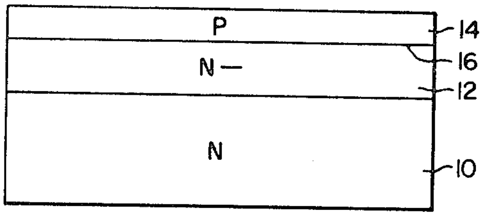

Referring now to FIG. 2, a region 14 of P-type semiconductivity silicon semiconductor material is epitaxially grown on the region 12 of N-type material. A PN-junction 16 is formed at the interface between the regions 12 and 14. The thickness and the resistivity of the region 14 are predetermined to control the "punch-through" of an electrical device embodying the body 10. When a high-speed power transistor made in accordance with this invention has a sustaining voltage of approximately 200 volts, the region 14 is from 4 to 6 microns in thickness and has a resistivity of from 0.3 to 0.6 ohm-centimeter. Preferably the region 14 has a resistivity of 0.5 ohm-centimeter and a thickness of 5 microns for a sustaining voltage of approximately 200 volts.

The base resistivity is designed so that with the base width, employed, the device embodying the body 10 is punch-through rather than avalanche limited. Punch-through limited devices have been observed experimentally to have better secondary breakdown performance. The high base resistivity also increases the emitter efficiency and consequently the gain of the device.

The region 14 must be an epitaxial region because the epitaxial growth process embodied in the manufacture of high-speed power transistors imparts desirable electrical characteristics to the material grown that can not be attained by diffusion techniques to form the base region 14. Why this great improvement occurs is not understood.

Additionally, it has been found that although a fast switching power transistor may have either (1) a diffused basic collector region, a base region diffused into the basic collector region, and an emitter diffused into the base region, or (2) an epitaxially grown basic collector region, a base region diffused in the basic collector region, or (3) an epitaxially grown basic collector region, a base region epitaxially grown on the basic collector region and an emitter region diffused into the base region, or (4) an initial substrate forming at least the basic collector region, a base region epitaxially grown on the basic collector region, and an emitter region diffused into the base region, all have apparently essentially similar structures, but the power transistors having an epitaxially grown base region as in (3) or (4) will have the fastest switching speed in comparison to base regions formed by diffusion in (1) and (2). This faster switching speed is believed to be the result of a more uniform impurity concentration profile within the base region thereby permitting less storage time of the carriers to occur within the base region 14.

Figure 3:
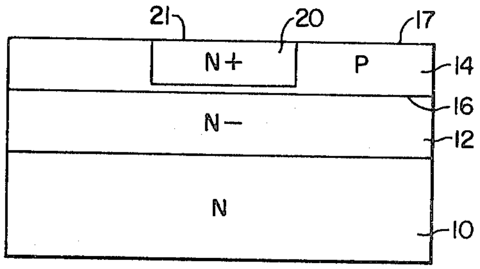

Referring now to FIG. 3, an emitter region 20 is formed in the region 14. The region 20 is of N-type semiconductivity and preferably has an impurity concentration sufficient to produce a region 20 of N+0 type semiconductivity the P-type region 14. The region 20 has a top surface 21 which is contiguous with and substantially in the same plane as a top surface 17 of the region 14. The region 20 may be formed by such suitable means as a diffusion process or an epitaxial growth process, either of which includes photolithographical masking techniques, protective oxide masking and selective etching techniques involving both the region 14 as well as the region 20.

Figure 6:
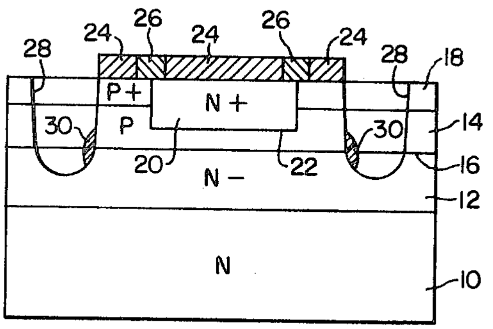
Figure 7:
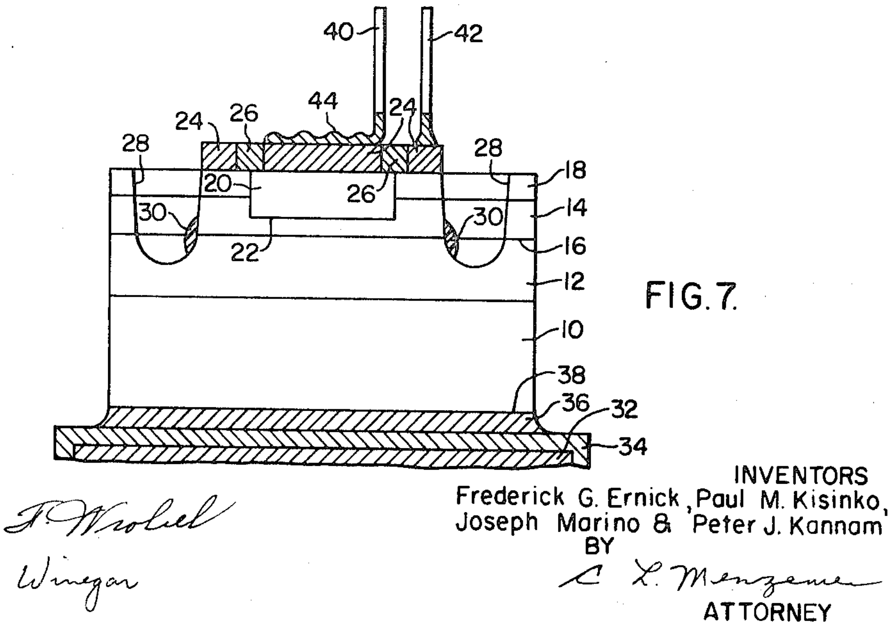

The body 10 as processed with the structure as shown in FIG. 3 and including the etching and the protection of exposed portions of the PN-junction 16 as shown in FIGS. 6 and 7 with a protective coating 30 is sufficient to act as a high-speed high-power transistor. However, it has been discovered that although the same structure also produces saturation voltages for the power transistor which may be acceptable, the saturation voltage characteristic of the transistor may be improved upon. This improvement in the saturation voltage of the power transistor also improves the secondary breakdown characteristic of the power transistor as well.

To achieve the improvement in the saturation voltage and secondary breakdown voltage characteristics of a power transistor made in accordance with the teachings of this invention, a region of P-type conductivity semiconductor material is disposed about emitter region 20 of the power transistor. This P-type region has a lower resistivity than the region 14 and contacts the emitter region 20 forming a PN-junction therebetween which is an extension of the PN-junction 22 between regions 14 and 20. The P-type region has a level of impurity concentration which makes it P+ conductivity relative to the conductivity of the region 14.

Figure 4:
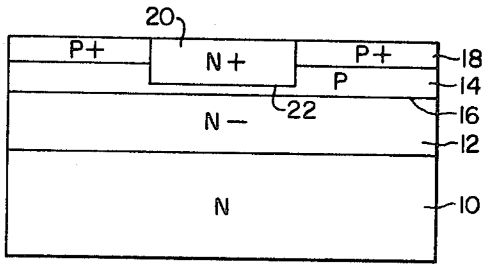

With reference to FIG. 4, to illustrate a method of processing the body of FIG. 2 to include a P+ region, a region 18 of P+ type semiconductivity is diffused within, or epitaxially grown on, the region 14. The P+ region has a sheet resistivity of from 150 to 350 ohms/square and an impurity concentration greater than $5\times10^{18}$. The region 18 functions to reduce the collector-emitter saturation voltage by reducing the base spreading resistance. The thickness of the region 18 is from 0.3 micron to 2 microns with a thickness of 1 micron being preferred.

Preferably the region 18 is formed by diffusion since either a selective or a nonselective diffusion process can be practiced. A selective diffusion process is preferred as an emitter region which is to be formed during a subsequent process step is diffused into the region 14 only and not through the region 18 and then into the region 14. This selective diffusion step avoids the degradation of gain of the body 12 relative to the collector current. The injection of carriers into a P-region from an N+ region is accomplished easily and the current gain is high. If a nonselective diffusion process is employed, electrons from an N+ region are injected into a P+ region. The flow of electrons occurs less readily than from a N+ to P-region and the current gain is not as great as previously accomplished.

Therefore, since a high gain transistor is desired, selective diffusion is the preferred process step since carriers are then injected into a high resistivity base region.

It has been discovered, however, that when the region 18 is no more than approximately 1 micron in thickness, a satisfactory emitter region can be diffused through the region 18 into the region 14 and the power transistor embodying this process technique is capable of operating at an emitter base voltage of from 5 to 10 volts and still have the desirable high gain which is obtainable through the selective diffusion process.

Figure 5:
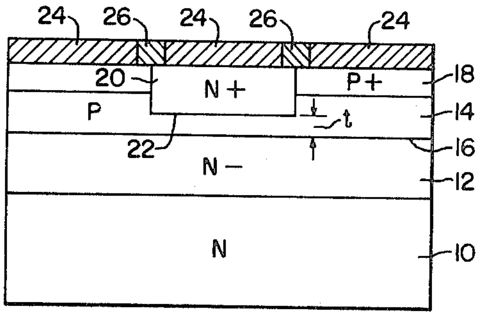

With reference to FIG. 5, and employing suitable processes known to those skilled in the art, such, for example as an oxidation process followed by photolithographic, selective etching and diffusion techniques, a region 20 of N+ type semiconductivity is formed in the region 14. A process embodying $POCl_3$ as the source of the phosphorus impurity is preferred since high deposition surface concentrations of the phosphorus be from $10^{20}$ to $10^{21}$ atoms per cubic centimeter. This preferred concentration range enables one to obtain a preferred junction depth averaging 3 microns based on the thickness of the base region 14 and a region 20 having a sheet resistivity of less than 3 ohms per square. A PN-junction 22 formed at the interface between the regions 20 and 14 provides a base width *t* which measures from 2.1 to 3.9 microns. If the base width *t* is greater than 3.9 microns, the breakdown voltage and the secondary breakdown voltage is increased but the frequency response and the gain of a transistor embodying the processed body 10 may be too low for the desired application of the transistor. If the base width *t* is less than 2.1 microns, the reverse is true.

A base width *t* having the range 2.1 microns to 3.9 microns is suitable for high-speed power devices which have a rating of sustained operating voltage of from 40 to 180 volts. However, in employing the chelating process described heretofore it has been found that the region 12 may be increased to approximately 45 microns in thickness and the base region may be increased to approximately 11 microns in thickness to provide a base width *t* may be as large as 8 microns for a high-speed power transistor having a sustained operating voltage of approximately 450 volts and a very satisfactory current gain $h_{FE}$, of 5 for a collector current rating of 20 amperes at a collector-emitter potential of 4 volts.

The processed body 10 enables one to obtain collector-emitter saturation voltages as low as those achieved with prior art devices having the region 14 formed by selective diffusion of the region 20 into the epitaxially grown region 14. However, the region 14 of this invention has a constant resistivity that cannot be achieved by diffusion. Thus the processed body 10 of this invention has the good secondary breakdown voltage performance of a single-diffused transistor as well as all of the desirable frequency response benefits achieved by epitaxially formed transistors.

A comparison of high-speed power transistors made in accordance with the teachings of the invention and having the basic transistor structure as shown in FIGS. 3 and 5 show the transistor having the basic structure of FIG. 5 to have the lowest saturation voltaGE. For example, high-speed power transistors having the basic structure of FIG. 3 had a saturation voltage of approximately 2 volts for a collector current of 20 amperes. High-speed power transistors having the basic structure of FIG. 5 at a collector current of 20 amperes had a saturation voltage of no greater than 1 volt.

The better secondary breakdown performance of high-speed power transistor embodying the basic transistor configuration as shown in FIG. 5 as compared to one having the basic configuration as shown in FIG. 3, may be explained as follows: When electrical contacts are affixed to the base and emitter regions of the transistors and current is caused to flow in the transistors, the greatest amount of thermal energy is produced in the transistor of the basic structural configuration of FIG. 3 and results in the poor secondary breakdown characteristics of the two transistor structures. In the transistor having the structure of FIG. 3, the current flowing from the base contact to the emitter-base junction 22 must flow through high resistivity base region 14. The greater the resistivity of region 14, the more thermal energy the transistor produces accompanied by a decrease in the secondary breakdown characteristic of the transistor. This is of concern to one employing the transistor as the thermal stability of the transistor may be affected enough to cause the transistor to run away electrically. This may occur when the current of the transistor increases rapidly resulting in the burnout and complete failure of the transistor.

On the other hand, the introduction of the P+ region 18 in the basic high-speed power transistor configuration of FIG. 5 introduces a region of low resistivity in the base region of the transistor. In the basic transistor structure of FIG. 5 the current flowing from the base contact to the emitter-base junction 22 flows through a lower resistivity region, region 18, than in the structure of FIG. 3. The resistivity of region 18 being lower, the same current employed in the transistor of the structure of FIG. 5 produces less thermal energy than it would in the transistor of the structure of FIG. 3. The result is that the transistor having the basic structure of FIG. 5 is more thermally stable and has a better secondary breakdown characteristic than that of FIG. 3.

Referring again to FIG. 5, a layer 26 of a material such as for example as an oxide, a carbide or a nitride is formed on the regions 18 and 20. The layer 26 preferably comprises an electrically insulating material, the purpose of which is to be described later. Employing photolithographic techniques and selective etching processes all of the layer 26, except for selective areas, is removed. A layer 24 of aluminum metal is disposed on the surface of the regions 18 and 20 as well as that of the remainder of the layer 26, by any suitable means known to those skilled in the art such, for example, as by evaporation in a vacuum evaporation chamber. The layer 24 is from 10,000 to 60,000 A. units in thickness with 40,000 A. units being preferred. Again employing photolithographic techniques, inverse contact masking and chemical etching processes, excess aluminum is removed from the body 10, particularly from the remaining portions of the layer 26 which electrically insulates the remaining portions of the layer 24 of metal disposed on the different regions 18 and 20 from each other. The processed body 10 is then placed in a suitable furnace and heated to 570° C. for approximately 2 minutes to alloy the aluminum to the respective regions 18 and 20.

Referring now to FIG. 6 there is shown a preferred embodiment of the processed body 10. Employing suitable means, such, for example an ultrasonic cavitation followed by chemical etching, an isolation groove 28 is formed within the outer periphery of the body 10. The groove 28 extends at least from the top surface of the region 18 across the PN-junction 16 and into the region 12. Among the several purposes that the groove 28 serves is its establishment of a reliable collector to base voltage and collector to emitter voltage. After etching, the walls of the groove 28 are smooth and minimize the current leakage across the PN-junction 16.

Additionally, in subsequently soldering a backup electrode to the bottom surface of the body 10, the solder employed to join the electrode to the body 10 has a tendency to ascend the side surfaces of the processed body 10 as a result of capillary action and electrically short circuiting the PN-junction 16 if it were not for the isolation groove 28. An additional protection for the exposed portions of the PN-junction 16 where it intersects the inner surface wall of the groove 28 is the application of a layer 30 of a protective coating material such, for example, a resinous material as a mixture of alizarin and a silicone polymer.

Referring now to FIG. 7, the processed body 10 is affixed to a suitable backup electrode, or contact member, 32. The electrode 32 comprises any suitable metal such, for example, as molybdenum, tungsten, tantalum, and combinations and base alloys thereof. Preferably the electrode 32 has at least a layer 34 of gold disposed on its surfaces. The gold layer 34 enables one to employ a solder with a melting temperature less than about 570° C. to affix the electrode 32 to the processed body 10. Usually a solder alloy melting at about 900° C. is employed to join an unplated electrode 32 to silicon semiconductor materials. However, in this instance the presence of the layer 24 of aluminum necessitates a lower melting temperature solder alloy. Preferably a layer 36 of a suitable solder alloy having a melting temperature of from 300° to no more than 570° C. such, for example, as a gold-silicon alloy solder, joins the gold-plated electrode 32 to the polished surface 38 of the body 10. The layer 36 must be substantially free of voids otherwise during the operation of a device embodying the processed body 10 "hot spots" may occur which may cause a premature failure of the secondary breakdown voltage requirements of the processed body 10.

Electrical leads 40 and 42 are affixed to the layer 24 of the respective regions 20 and 14 by any suitable means. The leads 40 and 42 comprise such suitable electrically conductive metals as aluminum, gold and silver. Preferably the leads 40 and 42 have a rectangular cross section to enable one to affix them to the layer 24 of aluminum by a preferred ultrasonic bonding technique.

In high-frequency transistor devices, it is very desirable that the transistor be capable of turning on fast. To enable the transistor to turn on fast, there must be a good electrical current distribution over the entire emitter area in as little time as possible. Preferably, therefore, one end 44 of the lead 40 forms a large area electrical contact to the layer 24 of the region 20. This enables one to distribute the electrical current of the lead 40 over a large surface area of the region 20 in a very short time interval.

High-speed power transistors made in accordance with the teachings of this invention are also suitable for use in compression bonded encapsulated electrical devices.

The following examples are illustrative of the teachings of this invention:

EXAMPLE I

Eight high-power, high-speed power transistors having an expitaxial base were made in accordance with the teachings of this invention. Each of the power transistors had a structure comprising a substrate of N-type semiconductivity silicon semiconductor material having a resistivity of 0.01 ohm-centimeter and a thickness of 15.0 microns. The first epitaxial layer was of N-type semiconductivity silicon having a thickness of 20 microns and a resistivity of 0.11 ohm-centimeter. The substrate and the first epitaxial layer form the collector region of the transistor. An epitaxial base region of silicon of a thickness of 5 microns was grown on the epitaxial portion of the collector region and had P-type semiconductivity, a resistivity of 0.5 ohm-centimeter and a constant impurity profile. The P-type dopant was boron. An emitter was formed in the epitaxial base region by phosphorous diffusion through the top surface of the epitaxial base region to form the emitter having N+ type semiconductivity and a sheet resistivity of 2.3 ohms per square. The base width of each transistor was 3.0 microns.

Four of these power transistor structures were modified before diffusion of the emitter region by forming a diffused region of P+ type semiconductivity by selective diffusion of boron through the top surface of the epitaxially grown base region except for the area where the emitter region was later diffused. The P+ type region had a thickness of 0.9 microns and a sheet resistivity of 300 ohms per square. The backup electrode for each power transistor was made of molybdenum and the electrical contacts to the base and emitter regions were each aluminum. The protective coating on the exposed portion of the collector-base junction consisted of a silicone polymer.

Each of the power devices were tested electrically. The electrical test results of the power transistors without a P+ region are tabulated in table I, the power transistors being designated 1, 2, 3 and 4. The power transistors with a P+ region were designated 5, 6, 7 and 8 and the electrical test results of these power transistors are tabulated in table II.

TABLE I

| Test conditions | $V_{CB}$=80V | $V_{EB}$=5V | $I_C$=200 ma. | $I_C$=20A $I_B$=2A | $V_{CE}$=3V $I_C$=5A | $V_{CE}$=3V $I_C$=15A | $V_{CE}$=4V $I_C$=20A | At 20 mcs. | $V_{CE}$=80V [1] pulse width =10 ms. |
|---|---|---|---|---|---|---|---|---|---|
| Parameters | $I_{CBO}$ | $I_{CBO}$ | $V_{CE}$(sus) | $V_{CE}$(sat) | $h_{FE}$ | $h_{FE}$ | $h_{FE}$ | $F_t$ | $I_C$=1A |
| Units | ma. | ma. | V | V | | | | mcs. | amp |
| Transistor number: | | | | | | | | | |
| 1 | 1.7 | 0.01 | 120 | 1.05 | 40 | 24.8 | 24.7 | 40 | 1.2. |
| 2 | 4.2 | 0.03 | 130 | 2.40 | 44 | 28.0 | 25.0 | 35 | 1.1. |
| 3 | 2.2 | 0.48 | 110 | 2.00 | 42 | 16.0 | 14.0 | 30 | 1.3. |
| 4 | 0.5 | 3.7 | 105 | 2.90 | 25 | 13.0 | 11.0 | 30 | 1.4. |

[1] This column records the amperage for a second breakdown test voltage of 80 volts for a pulse width of 10 milliseconds.

TABLE II

| Test conditions | $V_{CB}$=80V | $V_{EB}$=5V | $I_C$=200 ma. | $I_C$=20A $I_B$=2A | $V_{CE}$=3V $I_C$=5A | $V_{CE}$=3V $I_C$=15A | $V_{CE}$=4V $I_C$=20A | At 20 mcs. | $V_{CE}$=80V [1] pulse width =10 ms. |
|---|---|---|---|---|---|---|---|---|---|
| Parameters | $I_{CBO}$ | $I_{CBO}$ | $V_{CE}$(sus) | $V_{CE}$(sat) | $h_{FE}$ | $h_{FE}$ | $h_{FE}$ | $F_t$ | $I_C$=1A |
| Units | ma. | ma. | V | V | | | | mcs. | amp |
| Transistor Number: | | | | | | | | | |
| 5 | .01 | .03 | 120 | .9 | 55 | 25 | 20 | >40 | 1.3. |
| 6 | .5 | 1 | 155 | .8 | 125 | 47 | 32 | 54 | 1.5. |
| 7 | 1.0 | .01 | 105 | .9 | 100 | 38 | 28 | >40 | 1.5. |
| 8 | .03 | .04 | 130 | 1.0 | 83 | 33 | 25 | >40 | 1.3. |

[1] This column records the amperage for a secondary breakdown test voltage of 80 volts for a pulse width of 10 milliseconds.

A comparison of the test results shows that all of the power transistors having the P+ region have a saturation voltage of 1 volt or less for a collector current of 20 amperes. It is desirable to have a value of 1 volt or less for $V_{CE}$, since it represents a loss of power for the device. This power loss shows up as heat generated by the device which then must be properly dissipated. All power transistors exceeded 20 megacycles per second frequency response time ($F_t$) and 1 ampere current ($I_c$) at the secondary breakdown voltage $V_{CE}$ of 80 volts for 10 milliseconds.

EXAMPLE II

Five additional power transistors designated as 9, 10, 11, 12 and 13 were made in the same manner, and having the same structure, as power transistors 5, 6, 7 and 8 except for an additional cleaning process step. After each substrate was prepared and before the substrate was placed in the epitaxial growth furnace for growth of the N− and P+ regions, each substrate was cleaned in a solution of ammonical EDTA. After fabrication the power transistors were tested electrically and the results tabulated in table III.

A comparison of the power transistors 9 through 13 with the power transistors 5 through 8 indicated that the lifetime of both the N− and the P-regions were improved thereby decreasing the loss of carriers by recombination in the regions. The result is that the transistors having the substrate cleaned by chelating prior to epitaxial growth showed substantial improvements in the gain at collector currents of 5, 15 and 20 amperes. The improvement in gain also improved the saturation voltage of the transistors by approximately 20 percent with none of the power devices exceeding 0.73 volts for a collector current of 20 amperes. The range of sustaining voltages for both sets of power transistors were similar.

TABLE III

| Test conditions | $V_{CB}$=80V | $V_{EB}$=5V | $I_C$=200 ma. | $I_C$=20A $I_B$=2A | $V_{CE}$=3V $I_C$=5A | $V_{CE}$=3V $I_C$=15A | $V_{CE}$=4V $I_C$=20A | At 20 mcs. | $V_{CB}$=80V [1] pulse width =10 ms. |
|---|---|---|---|---|---|---|---|---|---|
| Parameters | $I_{CBO}$ | $I_{CBO}$ | $V_{CE}$(sus) | $V_{CE}$(sat) | $h_{FE}$ | $h_{FE}$ | $h_{FE}$ | $F_t$ | $I_C$=1A |
| Units | ma. | ma. | V | V | | | | mcs. | amp. |
| Transistor Number: | | | | | | | | | |
| 9 | .05 | .01 | 140 | .73 | 100 | 100 | 100 | 49 | 1.2. |
| 10 | .06 | .01 | 120 | .59 | 135 | 110 | 100 | 59 | 1.1. |
| 11 | .05 | .01 | 132 | .73 | 130 | 105 | 93 | 55 | 1.0. |
| 12 | .04 | .10 | 131 | .64 | 210 | 150 | 130 | 58 | 1.1. |
| 13 | .30 | .60 | 130 | .64 | 190 | 130 | 120 | 56 | 1.2. |

[1] This column records the amperage for a secondary breakdown test voltage of 80 volts for a pulse width of 10 milliseconds.

EXAMPLE III

Four power transistors, designated as 14, 15, 16 and 17 were made in the same manner as the power transistors 5, 6, 7 and 8 and four power transistors 18, 19, 20 and 21 were made in the same manner as the power transistors 9, 10, 11, 12 and 13 except that in each instance the N-region was 45 microns in thickness and had a resistivity of 40 ohm-centimeter, the P-region was boron doped, 11 microns in thickness and had a resistivity of 2 ohm-centimeter, and the emitter was diffused 8 microns deep to provide a base width of 11 microns. Each of the power transistors were electrically tested and the results obtained from testing transistors 14 through 17 are tabulated in table IV and those of transistors 18 through 21 are tabulated in table V.

A comparison of the tabulated results shows that chelating does make possible high-power, high-speed power transistors. With a collector to emitter voltage of 4 volts and a collector current of 20 amperes the transistors 18 through 21 still had a gain of 5 which is considered by those skilled in the art to be the minimum acceptable gain at a given collector current for any usable power transistor. The transistors 14 through 17 failed to have a gain of 5 even at a collector current rating of 5 amperes. In both groups of power transistors the saturation voltage was less than 1 volt at a collector current rating of 10 amperes which is a good electrical parameter for such a high sustaining voltage power transistor. The rating is made at $I_c$= 10 amperes which is a lower $I_c$ rating than previous power transistors but to obtain such a low saturation voltage in a high-power transistor while maintaining good gains is an acceptable trade off between electrical parameters.

TABLE IV

| Test conditions | $V_{CB}$=80V | $V_{EB}$=5V | $I_C$=200 ma. | $I_C$=10A $I_B$=2A | $V_{CE}$=3V $I_C$=5A | $V_{CE}$=3V $I_C$=15A | $V_{CE}$=4V $I_C$=20A | At 20 mcs. | $V_{CE}$=80V [1] pulse width =10 ms. |
|---|---|---|---|---|---|---|---|---|---|
| Parameters | $I_{CBO}$ | $I_{EBO}$ | $V_{CE}$(sus) | $V_{CE}$(sat) | $h_{FE}$ | $h_{FE}$ | $h_{FE}$ | $F_t$ | $I_C$=1A |
| Units | ma. | ma. | V | V | | | | mcs. | amp. |
| Transistor Number: | | | | | | | | | |
| 14 | .01 | .01 | 300 | 1.2 | 10 | 9 | <5 | 15 | >2A. |
| 15 | .01 | .2 | 320 | 2.0 | 6 | >5 | | 10 | >2A. |
| 16 | 1.0 | .1 | 320 | 1.5 | 11 | 10 | <5 | 12 | >2A. |
| 17 | .01 | .01 | 330 | 1.6 | 12 | 8 | | 14 | >2. |

[1] This column records the amperage for a secondary breakdown test voltage of 80 volts for a pulse width of 10 milliseconds.

TABLE V

| Test conditions | $V_{CB}$=80V | $V_{EB}$=5V | $I_C$=200 ma. | $I_C$=10A $I_B$=2A | $V_{CE}$=3V $I_C$=5A | $V_{CE}$=3V $I_C$=15A | $V_{CE}$=4V $I_C$=20A | At 20 mcs. | $V_{CE}$=80V [1] pulse width =10 ms. |
|---|---|---|---|---|---|---|---|---|---|
| Parameters | $I_{CBO}$ | $I_{EBO}$ | $V_{CE}$(sus) | $V_{CE}$(sat) | $h_{FE}$ | $h_{FE}$ | $h_{FE}$ | $F_t$ | $I_C$=1A |
| Units | ma. | ma. | V | V | | | | mcs. | amp. |
| Transistor Number: | | | | | | | | | |
| 18 | .003 | .004 | 349 | .80 | 58 | 13 | 5 | 38 | >2A. |
| 19 | .002 | .001 | 373 | .78 | 38 | 12 | 5 | 38 | >2A. |
| 20 | .015 | .005 | 369 | .74 | 55 | 13 | 5 | 35 | >2A. |
| 21 | .002 | .002 | 337 | .87 | 62 | 13 | 5 | 41 | >2A. |

[1] This column records the amperage for a secondary breakdown test voltage of 80 volts for a pulse width of 10 milliseconds.

Figure 8:
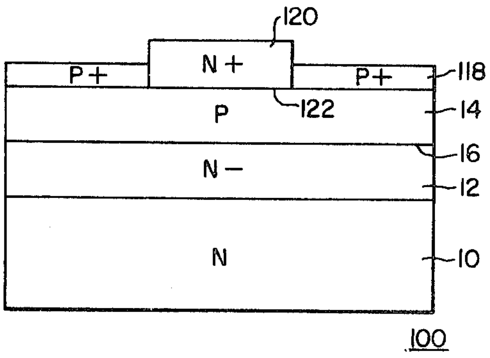
FIGS. 8 and 9 are cross-sectional views of an alternate embodiment of the teachings of this invention.
Figure 9:
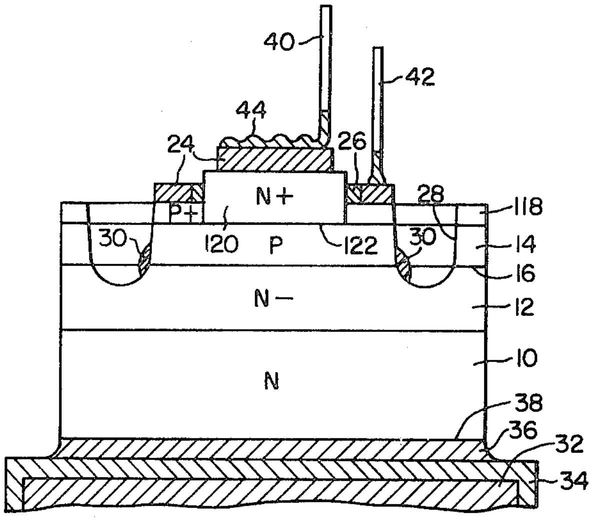

Alternate embodiments of the high-speed power transistor of this invention is shown in FIGS. 8 through 11. Referring now to FIG. 8 there is shown a semiconductor element 100 which is the same as the processed body 10 of semiconductor material except for the formation of the P+ region and the N+ region. In the element 100 a P+ region 118 is grown epitaxially on the region 14 as part of the continuous epitaxial growth process which may be employed to produce the regions 12 and 14. A layer of silicon oxide is grown on the P+ region 118 and employing photolithographical techniques and selective etching a window is opened through the oxide layer and the P+ region 118 to expose the region 14. An N+ region 120 is then grown on the oxide layer and the exposed surface of the region 14 thereby establishing a PN-junction 122 between regions 14 and 118 and 120. Again employing photolithographical techniques and selective etching the unwanted portions of the grown N+ material and the silicon oxide are removed leaving the structure of the element 100 as shown in FIG. 8. The element is completed in the same manner as before as shown in FIG. 9.

Figure 10:
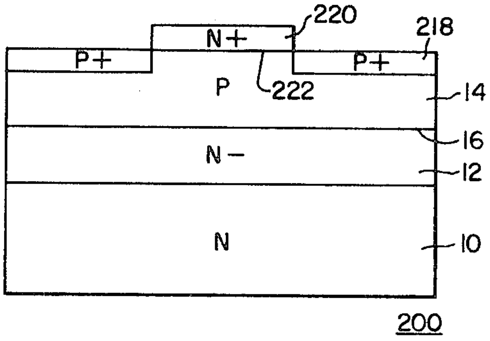
FIGS. 10 and 11 are cross-sectional views of another alternate embodiment of the teachings of this invention.

Referring to FIG. 10 there is shown still another alternate embodiment of the process body 110 in which a semiconductor element 200 is the same as the processed body 10 except an emitter region 220 is grown epitaxially on the region 14 thereby forming PN-junction 222. Employing photolithographical techniques diffusion, masking techniques and selective etching a region 218 of P+ conductivity is formed in the region 14 immediately about the region 220. The regions 218 and 220 have the same parameters as the regions 18 and 20 of the processed body 10.

Figure 11:
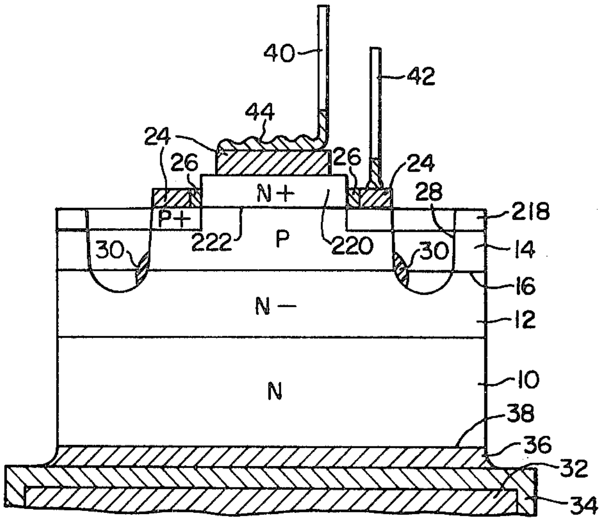

With reference to FIG. 11, the element 200 is completed in the same manner as described heretofore for the processed body 10.

We claim as our invention:

1. A semiconductor element suitable for use as a high-power, high-speed, silicon transistor comprising:

a collector region comprising a first region of N-type semiconductor material having two opposed major surfaces comprising a top surface and a bottom surface of said first region, a predetermined resistivity of less than 0.10 ohm-centimeter; and a second region of epitaxially deposited N-type semiconductor material having two opposed major surfaces comprising a top surface and a bottom surface of said second region, a resistivity of from 8 to 30 ohm-centimeter, a thickness of from 15 to 25 microns and a constant level of impurity concentration profile;

a third region of epitaxially deposited P-type semiconductor material forming a base region comprising a top surface and a bottom surface, said third region having a uniform resistivity of from 0.3 to 0.6 ohm-centimeter, and a constant level of impurity concentration profile and a thickness of from 4 to 6 microns at least a portion of the bottom surface of said third region, abutting at least the portion of the top surface of said second region and forming a first PN-junction therewith;

a fourth region of N-type semiconductor material having a top and a bottom surface at least one side surface extending from said top surface to said bottom surface, and a sheet resistivity of less than 3 ohms per square, at least the bottom surface of said fourth region abutting a part of said third region;

a second PN-junction formed at the bottom surface of said fourth region and said third region, the abutting bottom surface of said fourth region being substantially parallel to and spaced from 2.1 to 3.9 microns from said first PN-junction;

a diffused region of P-type semiconductor material formed in said third region, surrounding said fourth region, and including at least a portion of the remainder of the top surface of said third region, said diffused region having a thickness of less than 1 micron, a sheet resistivity of 150 to 350 ohms per square, and inner side surfaces contiguous with a portion of the side surface of said fourth region and forming a PN-junction therebetween which is integral with said second PN-junction.

2. The semiconductor device of claim 1 in which said first region has a resistivity of 0.01 ohm-centimeter;

said second region comprising an epitaxial layer having a resistivity of 11 ohm-centimeter and a thickness of 20 microns;

said third region comprising an epitaxial layer having a resistivity of 0.5 ohm-centimeter and a thickness of 5 microns; and said portion of said second PN-junction is a distance of 3 microns from said first PN-junction.

3. The semiconductor device of claim 2 in which said first region is comprised of antimony doped silicon.

4. The semiconductor element of claim 1 and including:

an annular groove disposed within the outer peripheral portion of the semiconductor element, said groove having a bottom surface and sidewalls, said bottom surface being disposed within said second region, and said sidewalls extending upwardly through said second region, across said first PN-junction, through said third region the surface of the element.

5. The semiconductor element of claim 4 including a layer of protective coating material disposed on all exposed surfaces of said first PN-junction within said groove.

6. A semiconductor element suitable for use as a high-power high-speed transistor comprising:

a collector region comprising a first region of N-type semiconductor material having a resistivity of 0.01 ohm-centimeters and a second region of N-type semiconductor material having a resistivity of 40 ohm-centimeters and a thickness of 45 microns located on and contiguous to said first region;

a base region comprising a third region of P-type semiconductor material having a resistivity of 2 ohm-centimeters and a thickness of 11 microns epitaxially deposited on said second region and forming a first PN-junction therewith;

a fourth region of N+ semiconductor material having a sheet resistivity of less than 3 ohms per square and having a bottom surface abutting said third regions and forming a second PN-junction therewith;

said second PN-junction being substantially parallel to and spaced 11 microns from said first PN-junction;

a fifth region of P+ semiconductor material having a sheet resistivity of 150 to 350 ohms per square, a thickness no greater than 1 micron, abutting a portion of the top surface of said third region and a portion of the peripheral surface of said fourth region;

the abutting surfaces of said fourth and fifth regions forming a third PN-junction, said third PN-junction being integral with said second PN-junction;

and an annular groove disposed within the outer peripheral portion of the element, said groove having a bottom surface and sidewalls, said bottom surface being disposed within said second region, and said sidewalls being integral with said bottom surface and extending upwardly through said second region, across said first PN-junction, through said third region, through said fifth region and intersecting the top surface of said fifth region.

7. The semiconductor element of claim 6 in which said first region of semiconductor material is antimony doped silicon, said third region of semiconductor material is boron doped silicon, and said fifth region of semiconductor material is P-type silicon doped with boron.

* * * * *